(12) United States Patent
Saito

(10) Patent No.: US 10,753,971 B2
(45) Date of Patent: Aug. 25, 2020

(54) HEAT EXCHANGER AND ELECTRONIC DEVICE HANDLING APPARATUS INCLUDING THE SAME

(71) Applicant: ADVANTEST CORPORATION, Tokyo (JP)

(72) Inventor: Noboru Saito, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 225 days.

(21) Appl. No.: 15/944,280

(22) Filed: Apr. 3, 2018

(65) Prior Publication Data
US 2019/0302178 A1    Oct. 3, 2019

(51) Int. Cl.
*G01R 31/28*    (2006.01)
*F16K 11/07*    (2006.01)
*F16K 3/04*     (2006.01)

(52) U.S. Cl.
CPC .......... *G01R 31/2874* (2013.01); *F16K 11/07* (2013.01); *G01R 31/2865* (2013.01); *F16K 3/04* (2013.01); *G01R 31/2808* (2013.01)

(58) Field of Classification Search
CPC ............ G01R 31/2874; G01R 31/2865; G01R 31/2808; G01R 31/2867; G01R 31/2875; F16K 11/07; F16K 3/04
See application file for complete search history.

(56) References Cited

U.S. PATENT DOCUMENTS

| | | | |
|---|---|---|---|
| 3,490,523 A * | 1/1970 | Esmond | F28F 3/12 165/166 |
| 2002/0109518 A1 * | 8/2002 | Saito | G01R 1/0458 324/750.09 |
| 2010/0163217 A1 | 7/2010 | Stuckey | |
| 2010/0175866 A1 | 7/2010 | Tani et al. | |
| 2011/0126931 A1 | 6/2011 | Ide et al. | |
| 2015/0268295 A1 | 9/2015 | Sasaki et al. | |

FOREIGN PATENT DOCUMENTS

WO    2009/035459 A1    3/2009

* cited by examiner

*Primary Examiner* — Amy He
(74) *Attorney, Agent, or Firm* — Osha Liang LLP

(57) ABSTRACT

A heat exchanger which exchanges heat with a DUT while contacting the DUT includes: a heat exchange block which thermally contacts the DUT; a first heat transfer sheet which overlaps a front end surface of the heat exchange block; a second heat transfer sheet which overlaps the front end surface of the heat exchange block through the first heat transfer sheet; and a first holding member which holds the second heat transfer sheet.

4 Claims, 5 Drawing Sheets

HEAT EXCHANGER AND ELECTRONIC DEVICE HANDLING APPARATUS INCLUDING THE SAME

TECHNICAL FIELD

The present invention relates to a heat exchanger exchanging heat with an electronic device (hereinafter, simply referred to as "DUT" (Device Under Test)) to be tested such as a semiconductor integrated circuit device while contacting the DUT at the time of testing the DUT, and an electronic device handling apparatus including the heat exchanger.

The contents described and/or illustrated in the documents relevant to U.S. Ser. No. 12/445,669 (US 2010/0175866 A) filed on Oct. 29, 2008, U.S. Ser. No. 12/742,178 (US 2011/0126931 A) filed on May 27, 2009, and U.S. Ser. No. 14/472,398 (US 2015/0268295 A) filed on Aug. 29, 2014 will be incorporated herein by reference as a part of the specification and/or drawings of the present application.

BACKGROUND ART

In order to suppress a non-uniform heat transfer to the DUT, a thermal contact member (TIM: Thermal Interface Material) in which carbon nanotubes are oriented in the thickness direction is provided between a heat transfer member and the DUT (See, for example, Patent Document 1). Further, a sheet-like TIM in which the carbon nanotubes are bundled with an elastomer is also known.

CITATION LIST

Patent Document

Patent Document 1: WO 2009/035459 A

SUMMARY OF THE INVENTION

Problem to be Solved by the Invention

In the above-described sheet-like TIM, since the carbon nanotubes are oriented in the thickness direction of the TIM, the elastomer splits along the carbon nanotubes so that the TIM is peeled off from the heat transfer member due to the repeated contact with the DUT. As a result, there is a problem that a peeled portion adheres to the DUT or falls into a socket.

An object of the invention is to provide a heat exchanger capable of preventing peeling of a TIM and an electronic device handling apparatus including the same.

Means for Solving Problem

[1] A heat exchanger according to the invention is a heat exchanger which exchanges heat with a DUT while contacting the DUT, including: a heat exchange block which thermally contacts the DUT; a first heat transfer sheet which overlaps a front end surface of the heat exchange block; a second heat transfer sheet which overlaps the front end surface of the heat exchange block through the first heat transfer sheet; and a first holding member which holds the second heat transfer sheet.

[2] In the above-described invention, the first heat transfer sheet may include: fibrous heat transfer members which are oriented in a thickness direction of the first heat transfer sheet; and an elastomer or rubber which holds the heat transfer members.

[3] In the above-described invention, the heat transfer members may include carbon nanotubes or carbon nanofibers.

[4] In the above-described invention, the second heat transfer sheet may be a metal foil formed of copper, aluminum, or an alloy thereof.

[5] In the above-described invention, the second heat transfer sheet may include a protrusion portion which protrudes from the first heat transfer sheet, and the first holding member may hold the protrusion portion.

[6] In the above-described invention, the first holding member may hold a surface opposite to a surface contacting the first heat transfer sheet in the second heat transfer sheet, and the heat exchanger may include a second holding member which surrounds the heat exchange block and to which the first holding member is fixed.

[7] An electronic device handling apparatus according to the invention is an electronic device handling apparatus including: a transfer arm which holds a DUT and presses the DUT against a socket; the above-described heat exchanger; and a temperature adjustment device which heats and/or cools the heat exchange block of the heat exchanger, wherein the heat exchange block is provided in the transfer arm.

[8] A heat exchanger according to the invention is a heat exchanger which exchanges heat with a DUT while contacting the DUT, including: a heat exchange block which thermally contacts the DUT; a first heat transfer sheet which overlaps a front end surface of the heat exchange block; a second heat transfer sheet which overlaps the front end surface of the heat exchange block through the first heat transfer sheet; and a suction holding mechanism which sucks and holds the second heat transfer sheet.

[9] In the above-described invention, the first heat transfer sheet may include: fibrous heat transfer members which are oriented in a thickness direction of the first heat transfer sheet; and an elastomer or rubber which holds the heat transfer members.

[10] In the above-described invention, the heat transfer members may include carbon nanotubes or carbon nanofibers.

[11] In the above-described invention, the second heat transfer sheet may be a metal foil formed of copper, aluminum, or an alloy thereof.

[12] In the above-described invention, the suction holding mechanism may include: a flow passage communicating with a space formed between the heat exchange block and the second heat transfer sheet; and a pressure reduction device connected to the flow passage and depressurizing the space through the flow passage.

[13] In the above-described invention, the suction holding mechanism may include a seal member that seals the space.

[14] An electronic device handling apparatus according to the invention is an electronic device handling apparatus including: a transfer arm which holds a DUT and presses the DUT against a socket; the above-described heat exchanger; and a temperature adjustment device which heats and/or cools the heat exchange block of the heat exchanger, wherein the heat exchange block is provided in the transfer arm.

Effect of the Invention

According to the invention, since the first heat transfer sheet overlapping the front end surface of the heat exchange block is further covered by the second heat transfer sheet, it is possible to prevent the peeling of the first heat transfer sheet.

MODE(S) FOR CARRYING OUT THE INVENTION

Hereinafter, embodiments of the invention will be described based on the drawings.

First Embodiment

Figure 1:
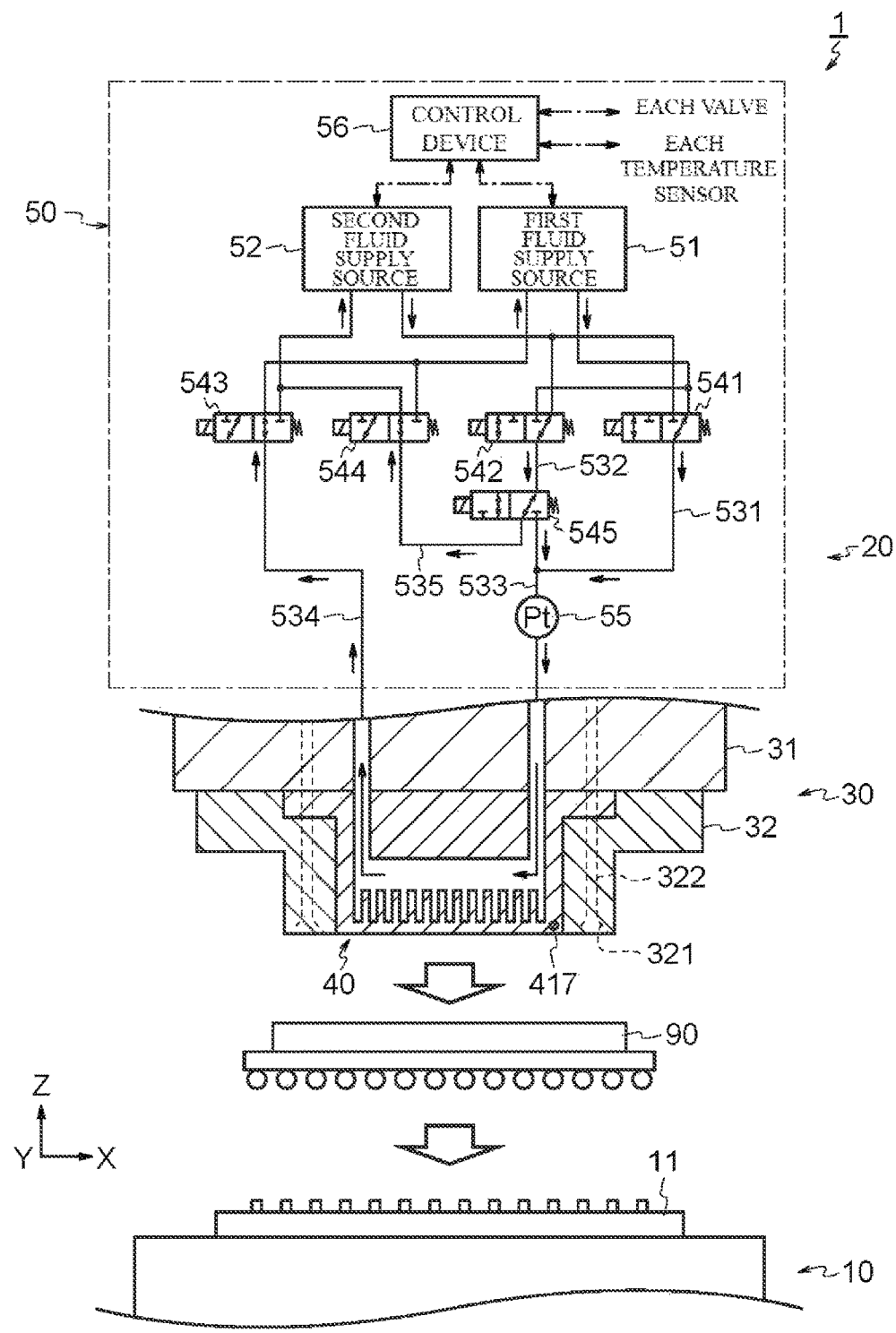
FIG. 1 is a diagram illustrating a main part of an electronic device testing apparatus in a first embodiment of the invention.
Figure 2:
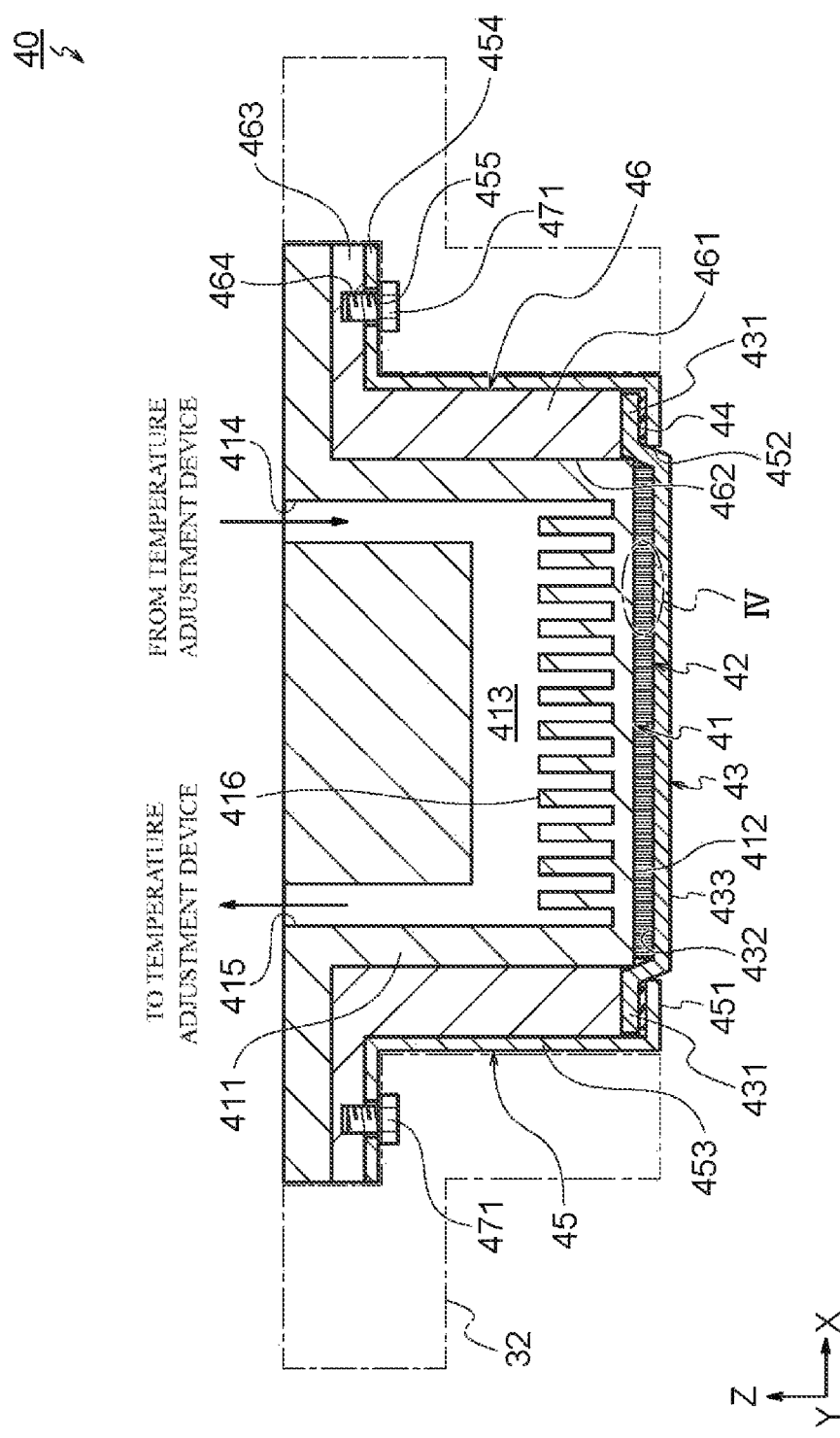
FIG. 2 is a cross-sectional view illustrating a DUT heat exchanger in the first embodiment of the invention.
Figure 3:
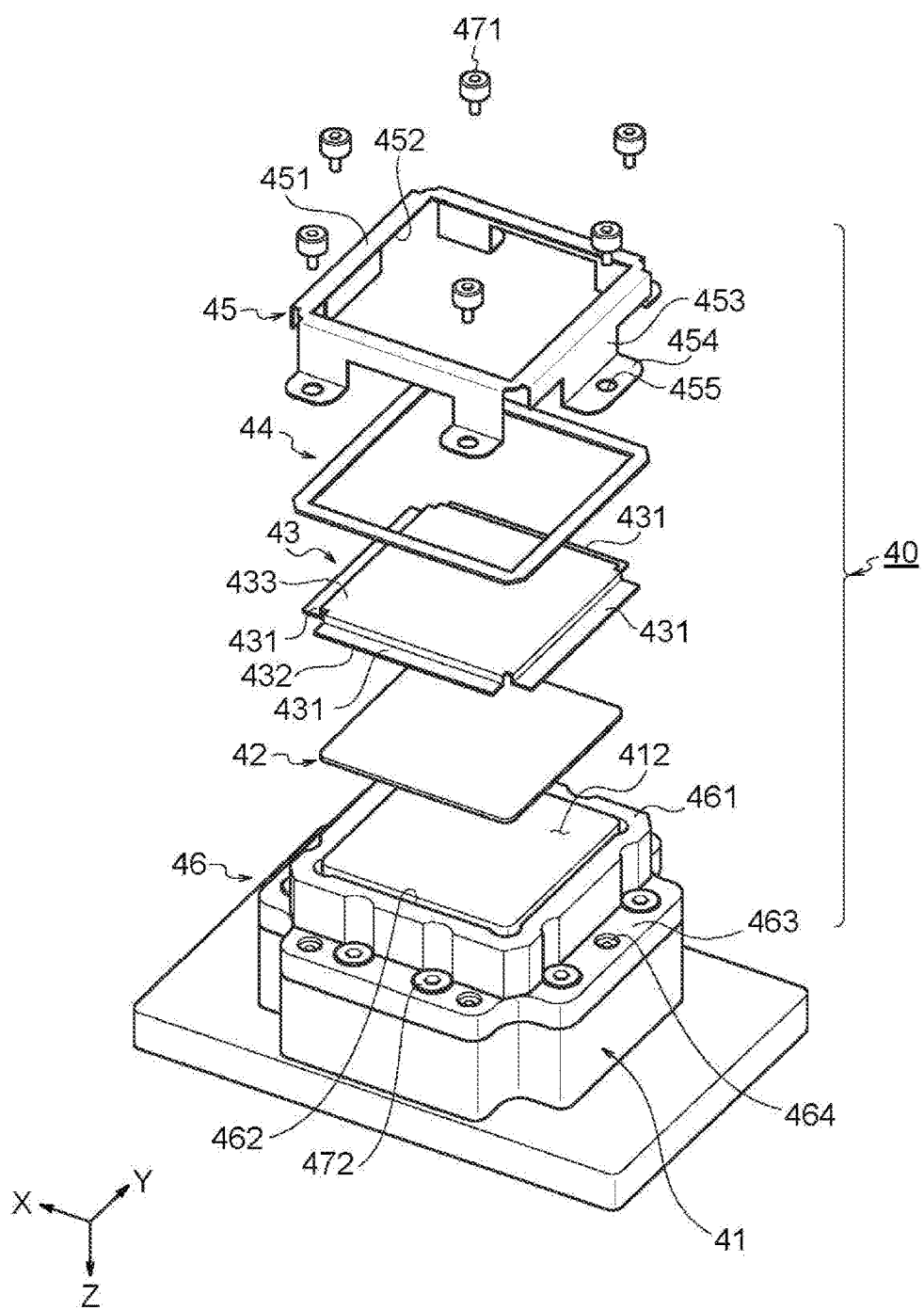
FIG. 3 is an exploded perspective view of the DUT heat exchanger illustrated in FIG. 2.
Figure 4:
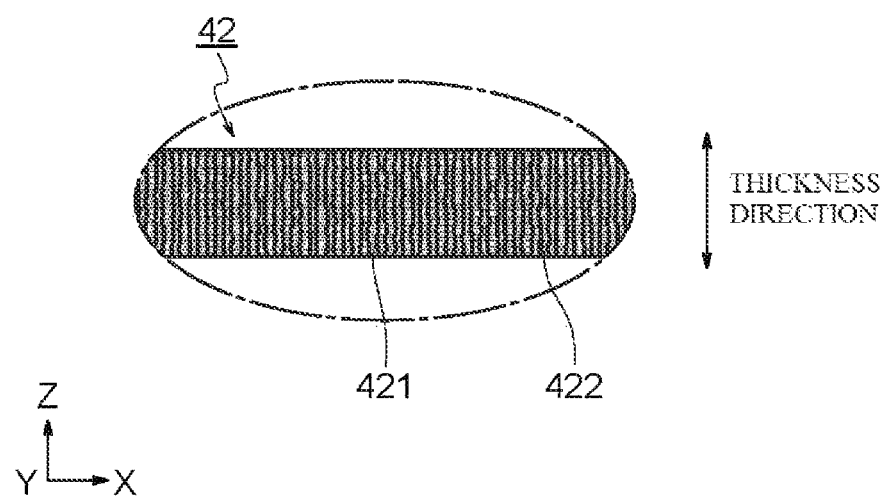
FIG. 4 is a cross-sectional view of a first heat transfer sheet in the first embodiment of the invention and is an enlarged view of a part IV of FIG. 2.

FIG. 1 is a diagram illustrating a main part of an electronic device testing apparatus in a first embodiment of the invention, FIG. 2 is a cross-sectional view illustrating a DUT heat exchanger in the first embodiment of the invention, FIG. 3 is an exploded perspective view of the DUT heat exchanger, and FIG. 4 is a cross-sectional view of a first heat transfer sheet in the first embodiment of the invention and is an enlarged view of a part IV of FIG. 2.

An electronic device testing apparatus 1 of the embodiment is a device which tests electrical characteristics of a DUT 90 which is an electronic device to be tested. The electronic device testing apparatus 1 includes, as illustrated in FIG. 1, a tester 10 and a handler 20.

The tester 10 includes a socket 11 to which the DUT 90 is electrically connected. The tester 10 tests the DUT 90 of which a temperature is controlled by a DUT heat exchanger 40 and a temperature adjustment device 50 to be described later. Specifically, the tester 10 inputs a test signal based on a test pattern for testing the DUT 90 to the DUT 90 and determines whether the DUT 90 is good or bad based on the signal output from the DUT 90 in response to the test signal. As a detailed example of the DUT 90, an analog circuit, a digital circuit, a memory, a system on chip (SOC), and the like can be exemplified.

The handler 20 is configured to handle the DUT 90 to press the DUT 90 which is not tested yet against the socket 11 and sort the DUT 90 on the basis of a test result. The handler 20 includes, as illustrated in FIG. 1, a contact arm 30 and the temperature adjustment device 50.

The contact arm 30 is a transfer arm which moves the DUT 90 in a held state and presses the DUT 90 against the socket 11. When the DUT 90 is pressed against the socket 11 by the contact arm 30, the DUT 90 and the socket 11 are electrically connected to each other. The temperature adjustment device 50 adjusts the temperature of the DUT 90 by using a first fluid and a second fluid while the DUT heat exchanger 40 (to be described later) of the contact arm 30 contacts the DUT 90.

The contact arm 30 includes an arm body 31, a contact chuck 32, and the DUT heat exchanger 40. By an actuator (not illustrated), the arm body 31 can move and rotate on the XY plane and can move up and down in the Z direction. The contact chuck 32 and the DUT heat exchanger 40 are attached to a front end of the arm body 31.

In the embodiment, the contact chuck 32 and the DUT heat exchanger 40 are attached to the arm body 31 so that the contact chuck 32 surrounds the DUT heat exchanger 40. The contact chuck 32 includes a plurality of suction pads 321 opening to a front end surface of the contact chuck 32. Each of the suction pads 321 communicates with a depressurization pump (not illustrated) through a flow passage 322 formed in the contact chuck 32 and the arm body 31. The contact arm 30 can hold the DUT 90 by sucking a surface of the DUT 90 using the suction pads 321.

The DUT heat exchanger 40 is a heat exchanger which exchanges heat with the DUT 90 while contacting the DUT 90. The DUT heat exchanger 40 includes, as illustrated in FIGS. 2 and 3, a thermal block 41, a first heat transfer sheet 42, a second heat transfer sheet 43, a rubber sheet 44, a first holding member 45, and a second holding member 46.

The thermal block 41 is a heat exchange block which is formed of a metal material having excellent thermal conductivity and thermally contacts the DUT 90 through the first and second heat transfer sheets 42 and 43 when the contact arm 30 holds the DUT 90. The thermal block 41 includes a convex portion 411 which protrudes in the −Z direction. When the contact arm 30 holds the DUT 90, a front end surface 412 of the convex portion 411 contacts the DUT 90 through the first and second heat transfer sheets 42 and 43.

A flow passage 413 through which a fluid can pass is formed inside the thermal block 41. An inlet 414 and an outlet 415 of the flow passage 413 are connected to the temperature adjustment device 50 through a flow passage formed in the arm body 31. Further, a heat sink 416 is provided in the vicinity of the front end surface 412 of the thermal block 41 in the flow passage 413. Further, as illustrated in FIG. 1, a temperature sensor 417 is embedded in the thermal block 41. A detection signal of the temperature sensor 417 is configured to be output to a control device 56 of a temperature adjustment device 60.

The first heat transfer sheet 42 overlaps the front end surface 412 of the thermal block 41. The first heat transfer sheet (the first TIM) 42 has substantially the same size as the front end surface 412 of the thermal block 41 and covers the front end surface 412. As illustrated in FIG. 4, the first heat transfer sheet 42 is a sheet-like member that includes a plurality of heat transfer members 421 and an elastomer 422 which holds the heat transfer members 421.

The heat transfer members 421 of the first heat transfer sheet 42 are fibrous members which are formed of carbon and are oriented in the thickness direction of the first heat transfer sheet 42. That is, the heat transfer members 421 extend in the thickness direction of the first heat transfer sheet 42. As a detailed example of the heat transfer members 421, carbon nanotubes, carbon nanofibers, and the like can be exemplified.

Further, the elastomer 422 of the first heat transfer sheet 42 interposes between the heat transfer members 421 and serves as a binder which holds the heat transfer members 421 in a bundled state. As a binder which holds the heat transfer member 421, rubber such as silicone rubber or fluorine rubber may be used instead of the elastomer.

As illustrated in FIGS. 2 and 3, the second heat transfer sheet 43 overlaps the front end surface 412 of the thermal block 41 through the first heat transfer sheet 42. In other words, the first heat transfer sheet 42 overlaps the front end surface 412 of the thermal block 41, and the second heat transfer sheet 43 overlaps the first heat transfer sheet 42. At this time, a first surface 432 of the second heat transfer sheet 43 contacts the first heat transfer sheet 42.

The second heat transfer sheet (the second TIM) 43 has an outer shape larger than the outer shape of the first heat transfer sheet 42 and covers the entire first heat transfer sheet 42. That is, an outer edge of the second heat transfer sheet 43 protrudes from the first heat transfer sheet 42, and the second heat transfer sheet 43 includes a protrusion portion 431 on the outer edge thereof. The second heat transfer sheet 43 is formed as a metal foil formed of copper, aluminum, or an alloy thereof.

The first holding member 45 includes a frame portion 451 and a plurality of legs 453. The frame portion 451 includes an opening 452 which is larger than the outer shape of the first heat transfer sheet 42 and smaller than the outer shape of the second heat transfer sheet 43. The first holding member 45 overlaps a second surface 433 of the second heat transfer sheet 43 so that the annular rubber sheet 44 is interposed between the frame portion 451 and the protrusion portion 431 of the second heat transfer sheet 43.

The leg 453 of the first holding member 45 extends from the frame portion 451 in the +Z direction. A front end of each leg 453 is provided with a bent piece 454 which is bent toward the XY plane. The bent piece 454 is provided with a through-hole 455.

The second holding member 46 includes a cylinder portion 461 and a flange 463 which is widened in the radial direction from one end of the cylinder portion 461. The cylinder portion 461 has an opening 462 larger than the convex portion 411 of the thermal block 41, and the convex portion 411 is inserted into the opening 462. Further, the protrusion portion 431 of the second heat transfer sheet 43 overlaps a front end surface of the cylinder portion 461, and the second holding member 46 holds the first surface 432 of the second heat transfer sheet 43.

Each fastening hole 464 is formed in the flange 463 at a position corresponding to the through-hole 455 of the first holding member 45. An inner peripheral surface of the fastening hole 464 is provided with a female screw corresponding to a male screw of a bolt 471.

The bent piece 454 of the first holding member 45 overlaps the flange 463, and the bolt 471 is fastened to the second holding member 46 through the through-hole 455 of the bent piece 454 so that the first holding member 45 is fixed to the second holding member 46. Accordingly, the second heat transfer sheet 43 is sandwiched between the first and second holding members 45 and 46, and the first heat transfer sheet 42 is sandwiched between the front end surface 412 of the thermal block 41 and the second heat transfer sheet 43. The DUT heat exchanger 40 is fixed to the thermal block 41 through a bolt 472.

The temperature adjustment device 50 is a device which adjusts the temperature of the DUT 90 so that a high-temperature test or a low-temperature test of the DUT 90 can be performed and the self-heating of the DUT 90 is offset. As the temperature adjustment device 50, a device disclosed in US 2015/0268295 A can be used. Specifically, the temperature adjustment device 50 includes, as illustrated in FIG. 1, a first fluid supply source 51, a second fluid supply source 52, first to fifth flow passages 531 to 535, first to fourth switches 541 to 544, a flow rate adjustment device 545, a temperature sensor 55, and a control device 56.

The first fluid supply source 51 adjusts a temperature of the first fluid to a first temperature and supplies the first fluid to the first flow passage 531 or the second flow passage 532. Meanwhile, the second fluid supply source 52 adjusts a temperature of the second fluid to a second temperature and supplies the second fluid to the second flow passage 532 or the first flow passage 531. The first and second temperatures are different temperatures. For example, the first temperature is a temperature lower than the second temperature. In this case, the first fluid serves as a cold medium, and the second fluid serves as a hot medium. As detailed examples of the first and second fluids, brine of a fluorine-based inert solution can be exemplified.

The first switch 541 switches a supply source to the first flow passage 531 to a first or second fluid supply source 51 or 52. Meanwhile, the second switch 542 switches a supply source to the second flow passage 532 to a second or first fluid supply source 52 or 51. The flow rate adjustment device 545 is provided in the second flow passage 532 and adjusts the flow rate of the fluid led from the second flow passage 532 to the third flow passage 533. As detailed examples of the first and second switches 541 and 542 and the flow rate adjustment device 545, a three-port valve can be exemplified.

The third flow passage 533 communicates with the inlet 414 of the flow passage 413 of the thermal block 41, and a mixed fluid flows in the flow passage 413. At this time, since heat is exchanged between the mixed fluid and the heat sink 416, the DUT 90 is heated or cooled.

The fourth flow passage 534 is connected to the outlet 415 of the flow passage 413 of the thermal block 41. A mixed fluid which has been used is discharged from the thermal block 41 to the fourth flow passage 534. The third switch 543 switches a connection target of the fourth flow passage 534 to the first or second fluid supply source 51 or 52. Meanwhile, a fluid which is not led to the third flow passage 533 is discharged from the flow rate adjustment device 545 to the fifth flow passage 535. The fourth switch 544 switches a connection target of the fifth flow passage 535 to the second or first fluid supply source 52 or 51. As detailed examples of the third and fourth switches 543 and 544, a three-port valve can be exemplified.

The temperature sensor 55 is provided in the third flow passage 533. A detection signal of the temperature sensor 417 is configured to be output to the control device 56 of the temperature adjustment device 60.

The control device 56 is configured to acquire detection signals from the temperature sensors 417 and 55 and to control the first and second fluid supply sources 51 and 52, the first to fourth switches 541 to 544, and the flow rate adjustment device 545. The control device 56 supplies a mixed fluid having an adjusted temperature to the heat sink 416 of the thermal block 41 so that a temperature of the DUT 90 becomes a target temperature. Specifically, the control device 56 adjusts a flow rate of a fluid led from the second flow passage 532 to the third flow passage 533 by controlling the flow rate adjustment device 545 according to pulse width modulation (PWM) based on the detection signals of the temperature sensors 417 and 55. Accordingly, a mixing ratio of the first fluid and the second fluid is adjusted, that is, a temperature of a mixed fluid is adjusted.

A configuration of the temperature adjustment device 50 is not limited to the above-described configuration. For example, as the temperature adjustment device, a device disclosed in US 2010/0175866 A can be used or a device disclosed in US 2011/0126931 A can be used. Further, the DUT 90 can be heated and cooled in the above-described device, but a device which heats or cools the DUT 90 may be used as the temperature adjustment device. For example, when the DUT 90 is just heated, a heater may be used as the temperature adjustment device.

As described above, according to the embodiment, since the first heat transfer sheet 42 overlapping the front end surface 412 of the thermal block 41 is further covered by the second heat transfer sheet 43, the peeling of the first heat transfer sheet 42 can be prevented. For this reason, it is possible to prevent a peeled portion of the first heat transfer sheet 42 from adhering to the DUT 90 or falling into the socket 11.

Second Embodiment

Figure 5:
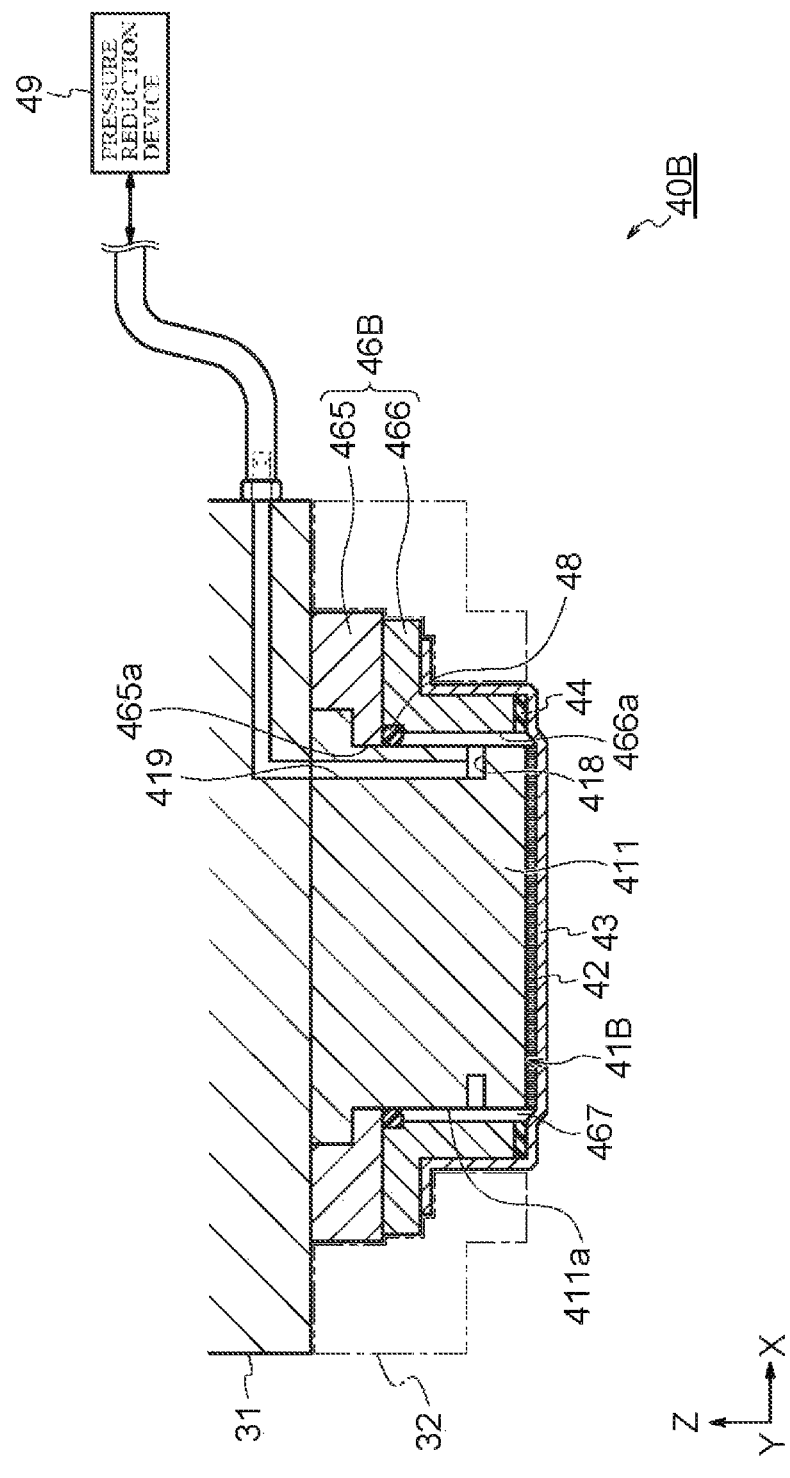
FIG. 5 is a cross-sectional view illustrating a DUT heat exchanger in a second embodiment of the invention.

FIG. 5 is a cross-sectional view illustrating a DUT heat exchanger in a second embodiment of the invention. The flow passage 413 and the like for circulating the fluid supplied from the temperature adjustment device 50 are not illustrated in FIG. 5 in order to help the understanding of the suction holding structure of the second heat transfer sheet 43.

In the embodiment, a configuration of the DUT heat exchanger is different from that of the first embodiment, but the other configurations are the same as those of the first embodiment. Hereinafter, an electronic device testing apparatus of the second embodiment will be described by focusing on a difference from the first embodiment. The same reference numerals will be given to the same components as those of the first embodiment and a description thereof will be omitted.

A DUT heat exchanger 40B of the embodiment includes, as illustrated in FIG. 5, a thermal block 41B, the first heat transfer sheet 42, the second heat transfer sheet 43, the rubber sheet 44, and a second holding member 46B. That is, the DUT heat exchanger 40B is different from the DUT heat exchanger 40 of the first embodiment in that (1) the first holding member 45 is not provided, (2) the thermal block 41B has a different configuration, and (3) the second holding member 46B has a different configuration.

The thermal block 41B is different from the thermal block 41 of the first embodiment in that a groove 418 and a flow passage 419 are provided. The groove 418 is formed in a side surface 411a of a convex portion 411 of the thermal block 41B and extends in the circumferential direction of the convex portion 411. The flow passage 419 communicates with the groove 418. The flow passage 419 is formed in the thermal block 41B and is connected to a pressure reduction device 49 through a flow passage or the like formed in the arm body 31. As a detailed example of the pressure reduction device 49, a vacuum pump can be exemplified.

The second holding member 46B is different from the second holding member 46B of the first embodiment in that two members 465 and 466 constitute the second holding member. The first annular member 465 includes an opening 465a into which the convex portion 411 of the thermal block 41B is inserted. The second annular member 466 also includes an opening 466a into which the convex portion 411 of the thermal block 41B is inserted. However, the opening 466a has an inner diameter larger than the inner diameter of the opening 455a of the first annular member 465, and a gap is formed between the inner peripheral surface of the opening 466a and the side surface 411a of the convex portion 411.

As illustrated in the same drawing, an O-ring 48 is interposed between an upper end of the second annular member 466 and the convex portion 411 of the thermal block 41B. Further, the annular rubber sheet 44 is interposed between a front end surface (a lower end surface in the drawing) of the first annular member 465 and the second heat transfer sheet 43. Thus, a space 467 which is surrounded by the convex portion 411 of the thermal block 41B, the second annular member 466, and the second heat transfer sheet 43 is sealed by the O-ring 48 and the rubber sheet 44.

In the embodiment, since the first heat transfer sheet 42 overlapping the front end surface 412 of the thermal block 41 is further covered by the second heat transfer sheet 43 similarly to the first embodiment, the peeling of the first heat transfer sheet 42 can be prevented. For this reason, it is possible to prevent a peeled portion of the first heat transfer sheet 42 from adhering to the DUT 90 or falling to the socket 11.

Further, when the outer shape of the DUT 90 is large, the outer shapes of the first and second heat transfer sheets 42 and 43 also increase, and slack and wrinkles are likely to occur in the first and second heat transfer sheets 42 and 43. Accordingly, there is a case in which the heat transfer between the thermal block 41 and the DUT 90 becomes non-uniform.

On the contrary, in the embodiment, when the pressure reduction device 49 starts to be driven, the space 467 is sucked through the flow passage 419 and the groove 418, and the space 467 is depressurized compared to the atmospheric pressure so that the second heat transfer sheet 43 is sucked and held by the thermal block 41B. Since the first and second heat transfer sheets 42 and 43 are stretched with the suction for the holding operation, it is possible to prevent the slack and wrinkles of the first and second heat transfer sheets 42 and 43 even when the outer shape of the DUT 90 is large.

It should be noted that the above-described embodiments are used to help the understanding of the invention and are not described to limit the invention. Therefore, each component disclosed in the above-described embodiments includes all modifications in design and equivalents belonging to the technical scope of the invention.

For example, the above-described heat exchanger may be used as a heat exchanger provided in a robot arm that holds and transfers a solid state drive (SSD) in a test device for SSD. That is, the SSD is also included in the DUT.

EXPLANATIONS OF LETTERS OR NUMERALS 1 electronic device testing apparatus device
10 tester
11 socket
20 handler
30 contact arm
31 arm body
32 contact chuck
40, 40B DUT heat exchanger
41 thermal block
411 convex portion
412 front end surface
413 flow passage
416 heat sink
42 first heat transfer sheet
421 fibrous heat transfer member
422 elastomer
43 second heat transfer sheet
45 first holding member
46 second holding member
50 temperature adjustment device
90 DUT

The invention claimed is:

1. A heat exchanger which exchanges heat with a Device Under Test (DUT) while contacting the DUT, comprising:

a heat exchange block which thermally contacts the DUT;
a first heat transfer sheet which overlaps a front end surface of the heat exchange block;
a second heat transfer sheet which overlaps the front end surface of the heat exchange block through the first heat transfer sheet; and
a suction holding mechanism which sucks and holds the second heat transfer sheet, wherein the suction holding mechanism includes:
 a flow passage communicating with a space formed between the heat exchange block and the second heat transfer sheet; and
 a pressure reduction device connected to the flow passage and depressurizing the space through the flow passage.

2. The heat exchanger according to claim 1, wherein the first heat transfer sheet includes:
fibrous heat transfer members which are oriented in a thickness direction of the first heat transfer sheet; and
an elastomer or rubber which holds the heat transfer members.

3. The heat exchanger according to claim 1, wherein the second heat transfer sheet is a metal foil formed of copper, aluminum, or an alloy thereof.

4. An electronic device handling apparatus comprising:
a transfer arm which holds a DUT and presses the DUT against a socket;
the heat exchanger according to claim 1; and
a temperature adjustment device which heats and/or cools the heat exchange block of the heat exchanger, wherein the heat exchange block is provided in the transfer arm.

* * * * *